(12) United States Patent
Castex et al.

(10) Patent No.: US 8,932,938 B2
(45) Date of Patent: Jan. 13, 2015

(54) METHOD OF FABRICATING A MULTILAYER STRUCTURE WITH CIRCUIT LAYER TRANSFER

(75) Inventors: Arnaud Castex, Grenoble (FR); Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 143 days.

(21) Appl. No.: 13/255,670

(22) PCT Filed: Mar. 4, 2010

(86) PCT No.: PCT/EP2010/052765
§ 371 (c)(1),
(2), (4) Date: Oct. 18, 2011

(87) PCT Pub. No.: WO2010/102943
PCT Pub. Date: Sep. 16, 2010

(65) Prior Publication Data
US 2012/0028440 A1 Feb. 2, 2012

(30) Foreign Application Priority Data
Mar. 12, 2009 (FR) ...................................... 09 51543

(51) Int. Cl.
*H01L 21/30* (2006.01)
*H01L 21/46* (2006.01)
*H01L 21/20* (2006.01)

(52) U.S. Cl.
CPC ................................... *H01L 21/2007* (2013.01)
USPC 438/455; 438/459; 257/E21.6; 257/E21.601; 257/E21.703

(58) Field of Classification Search
USPC ............... 438/455, 459; 257/E21.6, E21.601, 257/E21.703
See application file for complete search history.

(56) References Cited

U.S. PATENT DOCUMENTS

| | | |
|---|---|---|
| 3,728,694 A | 4/1973 | Rohrer |
| 5,131,968 A | 7/1992 | Wells et al. |
| 5,478,782 A | 12/1995 | Satoh et al. |
| 5,769,991 A | 6/1998 | Miyazawa et al. |
| 5,843,832 A | 12/1998 | Farmer et al. |
| 5,959,957 A | 9/1999 | Ikeda et al. |

(Continued)

FOREIGN PATENT DOCUMENTS

| | | |
|---|---|---|
| EP | 0410679 A | 1/1991 |
| EP | 1698460 A | 9/2006 |

(Continued)

OTHER PUBLICATIONS

International Written Opinion for International Application No. PCT/EP2010/052765 dated Apr. 26, 2010, 4 pages.

(Continued)

*Primary Examiner* — Robert Huber
(74) *Attorney, Agent, or Firm* — TraskBritt

(57) ABSTRACT

A method of producing a composite structure comprises a step of producing a first layer of microcomponents on one face of a first substrate, the first substrate being held flush against a holding surface of a first support during production of the microcomponents, and a step of bonding the face of the first substrate comprising the layer of microcomponents onto a second substrate. During the bonding step, the first substrate is held flush against a second support, the holding surface of which has a flatness that is less than or equal to that of the first support used during production of the first layer of microcomponents.

16 Claims, 5 Drawing Sheets

(56) References Cited

U.S. PATENT DOCUMENTS

| | | | |
|---|---|---|---|
| 5,962,792 A | 10/1999 | Kimerer, Jr. | |
| 6,335,263 B1 | 1/2002 | Cheung et al. | |
| 6,620,285 B2 | 9/2003 | Tomita et al. | |
| 6,969,667 B2 | 11/2005 | Liebeskind et al. | |
| 7,084,045 B2 * | 8/2006 | Takayama et al. | 438/455 |
| 7,601,271 B2 | 10/2009 | Kerdiles et al. | |
| 8,163,570 B2 | 4/2012 | Castex et al. | |
| 2002/0069964 A1 | 6/2002 | Noda et al. | |
| 2002/0127821 A1 | 9/2002 | Ohya et al. | |
| 2003/0183307 A1 | 10/2003 | Liebeskind et al. | |
| 2004/0110320 A1 | 6/2004 | Aspar et al. | |
| 2004/0246795 A1 | 12/2004 | Tomita | |
| 2004/0262772 A1 | 12/2004 | Ramanathan et al. | |
| 2005/0178495 A1 | 8/2005 | Aspar et al. | |
| 2005/0260828 A1 | 11/2005 | Yuasa | |
| 2006/0030074 A1 | 2/2006 | Mund et al. | |
| 2006/0043512 A1 | 3/2006 | Oliver et al. | |
| 2006/0044450 A1 | 3/2006 | Wolterink et al. | |
| 2006/0060074 A1 | 3/2006 | Ham et al. | |
| 2006/0180860 A1 | 8/2006 | Pan et al. | |
| 2006/0192230 A1 | 8/2006 | Wood et al. | |
| 2006/0210234 A1 | 9/2006 | Shiv et al. | |
| 2007/0004172 A1 | 1/2007 | Yang | |
| 2007/0087531 A1 | 4/2007 | Kirk et al. | |
| 2007/0090299 A1 | 4/2007 | Kozakai et al. | |
| 2007/0119812 A1 | 5/2007 | Kerdiles et al. | |
| 2007/0148480 A1 | 6/2007 | Ishiwata et al. | |
| 2007/0181246 A1 * | 8/2007 | Yamashita et al. | 156/235 |
| 2007/0207566 A1 | 9/2007 | Fu et al. | |
| 2008/0132032 A1 * | 6/2008 | Tomita et al. | 438/455 |
| 2008/0245472 A1 * | 10/2008 | Hirata et al. | 156/264 |
| 2008/0296584 A1 | 12/2008 | Hachigo | |
| 2009/0081432 A1 | 3/2009 | Gomi | |
| 2009/0275165 A1 | 11/2009 | Pourquier | |
| 2009/0280595 A1 | 11/2009 | Broekaart et al. | |
| 2011/0278691 A1 | 11/2011 | Castex et al. | |
| 2011/0287604 A1 | 11/2011 | Castex et al. | |
| 2012/0028440 A1 | 2/2012 | Castex et al. | |

FOREIGN PATENT DOCUMENTS

| | | |
|---|---|---|
| EP | 1777278 A | 4/2007 |
| FR | 2866982 A | 9/2005 |
| FR | 2931014 A | 11/2009 |
| JP | 05152181 A | 6/1993 |
| JP | 09148207 A | 6/1997 |
| JP | 10256107 A | 9/1998 |
| JP | 11026733 A | 1/1999 |
| JP | 2002190435 A | 7/2002 |
| JP | 2006303087 A | 11/2006 |
| KR | 1020080063857 A | 7/2008 |
| WO | 02071475 A | 9/2002 |
| WO | 03081664 A | 10/2003 |
| WO | 2006078631 A2 | 7/2006 |
| WO | 2010023082 A1 | 3/2010 |
| WO | 2010102943 A1 | 9/2010 |

OTHER PUBLICATIONS

International Preliminary Report on Patentability for International Application No. PCT/EP2010/052765 dated Sep. 13, 2011, 5 pages.

Burns et al., A Wafer Scale 3 D Circuit Integration Technology, IEEE Transactions On Electron Devices, vol. 53, No. 10, Oct. 2006, pp. 2507-2516.

Haisma et al., Silicon Wafer Fabrication and (Potential) Applications of Direct Bonded Silicon, Philips Journal of Research, vol. 49, No. 1/2, 1995, pp. 65-89.

Horie et al: "Advanced Soi Devices Using CMP and Wafer Bonding": Extended Abstracts of the Intn. Conf. on Solid State Devices and Materials; Japan Society of Applied Physics; Tokyo JP vol. Con. 1996; pp. 473-475.

Kim-Lee et al., "Capillary assisted alignment for high density wafer-level integration," in Proceedings of Conference on Wafer Bonding for MEMS Technologies and Wafer-Level Integration, Slides 1-26 (2007).

Steen et al., Overlay as the Key to Drive Wafer Scale 3D Integration, Microelectronic Engineering, vol. 84 (2007) pp. 1412-1415.

Turner et al., "Mechanics of wafer bonding: Effect of clamping," Journal of Applied Physics, vol. 95, 349-55 (2004).

Turner et al., "Modeling of direct wafer bonding: Effect of wafer bow and etch patterns," Journal of Applied Physics, 92, 7658-66 (2002).

Turner et al., "Predicting distortions and overlay errors due to wafer deformation during chucking on lithography scanners," Journal of Micro/Nanolithography, MEMS, and MOEMS, 8, 043015 (2009) 8 pages.

International Search Report for International Application No. PCT/EP2009/060250 mailed Oct. 9, 2009, 3 pages.

International Search Report for International Application No. PCT/EP2010/052765 mailed Apr. 26, 2010, 2 pages.

Japanese Office Action for Japanese Patent Application No. P2012-515447 dated Aug. 13, 2013, 4 pages.

\* cited by examiner

METHOD OF FABRICATING A MULTILAYER STRUCTURE WITH CIRCUIT LAYER TRANSFER

CROSS-REFERENCE TO RELATED APPLICATIONS

This is a national phase entry under 35 U.S.C. §371 of International Patent Application PCT/EP2010/052765, filed Mar. 4, 2010, published in English as International Patent Publication WO 2010/102943 A1 on Sep. 16, 2010, which claims the benefit under Article 8 of the Patent Cooperation Treaty to French Patent Application Serial No. 0951543, filed Mar. 12, 2009, the entire disclosure of each of which is hereby incorporated herein by this reference.

TECHNICAL FIELD

The present invention relates to the field of multilayer semiconductor structures (also known as multilayer semiconductor wafers) produced by transferring at least one layer formed from an initial substrate onto a final substrate, the layer corresponding to the portion of initial substrate in which a plurality of microcomponents has been formed, for example.

BACKGROUND

Three-dimensional component integration technology (3D-integration) requires the transfer of one or more layers of microcomponents onto a final substrate, the final substrate itself possibly incorporating microcomponents. The transferred layer or layers include microcomponents (electronic, optoelectronic, etc., components) produced at least in part on an initial substrate, the layers then being stacked on a final substrate. Primarily because of the very small size and large numbers of microcomponents present on a single layer, each transferred layer must be positioned on the final substrate with great accuracy so that they are very closely aligned with the subjacent layer. Further, it may be necessary to carry out treatments on the layer after its transfer, for example, to form other microcomponents, in order to expose the microcomponents on the surface, to produce interconnections, etc.; the treatments also have to be carried out with great accuracy in regard to the components present in the layer.

However, the applicants have discerned that following transfer, there are circumstances where it is very difficult, if not impossible, to form additional microcomponents that are aligned with all of the microcomponents formed before the transfer.

This phenomenon of misalignment is described in relation to FIGS. 1A to 1F, which illustrate an example of the production of a three-dimensional structure by transfer of a layer of microcomponents formed on an initial substrate onto a final substrate followed by the formation of an additional layer of microcomponents on the exposed face of the initial substrate after bonding. FIG. 1A illustrates an initial substrate 10 that has its own shape or "inherent geometry." In fact, as represented in a deliberately exaggerated manner in FIG. 1A and using a grid (dotted lines) to make the deformation zones visible, the initial substrate 10 is constituted by a wafer of semiconductor material that has deformations on the micrometric scale that principally correspond to a bow and to a warp or buckle. The bow of a wafer characterizes the concave or convex deformation of the wafer as a measurement of the position from the median surface to the center of the wafer, while the warp characterizes the deformations corresponding to the differences between the maximum distance and the minimum distance of the median surface relative to a reference plane, over the whole of the median surface of the wafer. These two types of deformation mean that the inherent geometry of a wafer can be characterized; for simplification, this can be classified as chip type geometry.

As can be seen in FIGS. 1B and 1C, a first series of microcomponents 11 is formed on the surface of the initial substrate 10. The microcomponents 11 are defined by photolithography using a mask that can define the zones for forming patterns corresponding to the microcomponents 11 to be produced. As the microcomponents 11 are being defined by photolithography, the initial substrate 10 is held on a substrate carrier device 12. The substrate carrier device comprises a support platen 12a on which the initial substrate 10 is held flush, for example, by means of an electrostatic system or a suction system associated with the support platen 12a. The substrate carrier device 12 can hold the initial substrate 10 in a "stiffened" position, i.e., in a position in which bow/warp type deformations of the initial substrate 10 are reduced compared with those presented by the same substrate when it is not held by the device 12. In other words, the microcomponents 11 are formed on a substrate that is initially slightly stressed (under tension or in compression), the stresses being relaxed once the substrate is freed from the device 12. The level of that stress is also linked to the temperature to which the substrate is subjected during the step of defining the microcomponents, that temperature possibly being the ambient temperature of the environment, or a controlled temperature imposed by the substrate carrier device.

As can be seen in FIG. 1D, the face of the initial substrate 10 comprising the microcomponents 11 is then brought into intimate contact with one face of a final substrate 20. Bonding between the initial substrate 10 and the final substrate 20 is carried out, for example, and preferably by wafer bonding. A buried layer of microcomponents 11 at the bonding interface between the substrates 10 and 20 is thus obtained. After bonding and as can be seen in FIG. 1E, the initial substrate 10 is thinned in order to withdraw a portion of the material present above the layer of microcomponents 11. Thus, a composite structure 30 is obtained formed by the final substrate 20 and a layer 10a corresponding to the remaining portion of the initial substrate 10.

Once it has been bonded to the final substrate 20, the geometry of the initial substrate 10 is different from that which it had initially in FIG. 1A. This new geometry of the initial substrate 10 after bonding results, in particular, from the fact that the final substrate 20 also has an inherent geometry with bow/warp deformations that differ from those originally presented by the initial substrate 10. As a consequence, when the initial substrate 10 is brought into intimate contact with the final substrate 20, the initial substrate 10 and the final substrate 20 have to adapt, at least in part, to each others' geometries, which creates zones of tensile and compressive stresses in each of the initial 10 and final 20 substrates. When they relax, these stresses cause a modification in the geometry of the initial substrate, i.e., a modification of its original bow/warp type deformations.

This modification of the geometry of the initial substrate 10 is even more pronounced after it has been thinned (FIG. 1E). Once thinned, the thickness of the remaining portion of the initial substrate 10, corresponding to the layer 10a, is much smaller than that of the final substrate 20 that then "imposes" its geometry to a greater extent on the structure as a whole. The layer 10a must then conform to the geometry of the final substrate 20 and thus further deviate from the starting geometry of the initial substrate 10.

As can be seen in FIG. 1F, the next step in producing the three-dimensional structure consists in forming a second layer of microcomponents 12 on the exposed surface of the thinned initial substrate 10. In order to define the microcomponents 12 in alignment with the buried microcomponents 11, a photolithography mask similar to that used to form the microcomponents 11 is used. The transferred layers, like the layer 10a, typically include marks, both at the level of the microcomponents and at the level of the wafer forming the layer, which are used by the positioning and aligning tools during the technical treatment steps that are carried out during photolithography.

However, even when positioning tools are used, offsets occur between some of the microcomponents 11 and 12, such as the offsets $\Delta_{11}$, $\Delta_{44}$, or $\Delta_{88}$ indicated in FIG. 1F (respectively corresponding to the offsets observed between the pairs of microcomponents $11_1/12_1$, $11_4/12_4$ and $11_8/12_8$). As when forming the microcomponents 11, the composite structure 30 formed by the final substrate 20 and the layer 10a is likewise held flush against a support platen 13a of a substrate carrier device 13 that is identical to the device 12. The zones of stress (tension and compression) imposed on the composite structure 30 and, in particular, on the layer 10a are at least in part different from those present during the formation of the microcomponents 11, since the layer 10a has a geometry in terms of bow/warp deformations that is different from that presented by the substrate 10 before bonding and thinning. As a consequence, this results in a phenomenon of misalignment (also known as overlay) between the two layers of microcomponents 11 and 12 that may be the source of short circuits or connection faults between the microcomponents of the two layers. That phenomenon of overlay thus results in a reduction in the quality and value of the multilayer semiconductor wafers that are fabricated. The impact of this phenomenon is becoming greater because of the constant demand for increasing the miniaturization of microcomponents and for increasing their integration density per layer.

Photolithography tools include algorithms for correcting certain modes of overlay (rotation, translation, etc.) that may be applied to attempt to minimize the overlay between two steps of defining or forming the components. However, it has been observed that this misalignment is not homogeneous (i.e., cannot be reduced to elementary transformations); thus, it is not possible to correct the photolithography exposure in a general and satisfactory manner in order to obtain, for each exposed field of the wafer, a satisfactory maximum value for the overlay (for example, less than 100 nm [nanometer] or 50 nm). A correction of the parameters governing the lithography exposure for each field of the wafer is not industrially desirable, and so it is important to seek to optimize the set of parameters that might lead to overlay.

Further, when a layer of microcomponents is transferred onto a final substrate having a first layer of microcomponents, it is very important to be able to minimize the overlay between the microcomponents of each of the layers when they are to be interconnected. Under such circumstances, it is not possible to compensate for overlays existing between the microcomponents of the two layers by lithography.

SUMMARY OF THE INVENTION

The aim of the invention is to propose a solution that, during fabrication of multilayer or composite structures, can reduce the phenomenon of overlay and distortion between the microcomponents formed on one face of a first substrate and the microcomponents subsequently formed on another face of the substrate after transfer onto a second substrate.

To this end, the present invention proposes a method of producing a composite structure, comprising a step of producing a first layer of microcomponents on one face of a first substrate, the first substrate being held flush against a holding surface of a first support during production of the microcomponents, and a step of bonding the face of the first substrate comprising the layer of microcomponents onto a second substrate, the method being characterized in that during the bonding step, the first or second substrate is held flush against a holding surface of a second support that has a flatness that is less than or equal to that of the first support used during production of the microcomponents.

Thus, by holding, during bonding, one of the two substrates flush against a holding surface of a support, i.e., the surface with which the substrate is held flush, that presents at its surface a flatness that is identical to or less than that of the holding surface of the support used during formation of the microcomponents, the risks of overlay and distortion during subsequent formation of additional layers of microcomponents are substantially reduced.

By fixing the first substrate during bonding in a geometric configuration, at least in terms of bow/warp type deformations, that is similar to that presented thereby when the microcomponents are formed, it is possible to regain that geometric configuration during formation of an additional layer of microcomponents on the other face of the first substrate. Even if the first substrate has a different geometry once released following bonding, for example. due to the difference in geometry compared with the second substrate, the first substrate regains its geometry presented at the moment of bonding when the second substrate was being held flush against a support having a similar flatness to that of the flat reference support used during production of the microcomponents. In this manner, during formation of the second layer of microcomponents on the face of the first substrate opposite to that comprising the first layer of microcomponents or on the exposed face of the first layer, the reliability of the alignment of the photolithography mask with the microcomponents of the first layer or the first face of the layer and, as a result, the quality and value of the wafer are improved.

In accordance with a particular characteristic of the invention, the flatness of the holding surface of the first support is 2 μm [micrometer] or less.

In accordance with one aspect of the invention, during the bonding step, the first substrate is held flush against the second support.

In accordance with another aspect of the invention, during the bonding step, at least the first substrate is maintained at a temperature substantially equivalent (preferably by ±0.5° C. or less) to the temperature to which it is subjected during the step of producing the first layer of microcomponents.

In accordance with another aspect of the invention, during the bonding step, the first and second substrates are maintained at a substantially equivalent temperature. The temperature difference between the first and the second substrates is preferably ±0.5° C. or less.

In accordance with a particular characteristic of the invention, after the bonding step, the method comprises a step of thinning the first substrate.

In accordance with another particular characteristic of the invention, the method further comprises a step of producing a second layer of microcomponents on the face of the first substrate opposite to the face comprising the first layer of microcomponents.

Before the bonding step, the method may comprise a step of forming a layer of oxide on the face of the first substrate comprising the first layer of microcomponents.

In accordance with a particular aspect of the invention, the first substrate is constituted by an SOI type structure.

During the step of producing the first layer of microcomponents and the bonding step, it is possible to use a substrate carrier device comprising a support platen with which the first substrate is flush, the substrate carrier device being capable of holding the first substrate flush against the support platen.

The first substrate may be held flush against the support platen by suction (vacuum pump), by capillary attraction (substrate held flush against a rigid support, for example, formed from marble, and retained thereon by capillary attraction), or by an electrostatic force. The use of an electrostatic force is especially useful when vacuum bonding is to be carried out.

The present invention also provides an apparatus for wafer bonding substrates, the apparatus comprising a substrate carrier device, and being characterized in that the substrate carrier device comprises a holding surface for a substrate having a flatness of 2 micrometers or less.

In accordance with one characteristic of the bonding apparatus of the invention, the substrate carrier device is adapted to receive circular substrates (wafers) 200 mm (millimeters) or 300 mm in diameter.

In accordance with another characteristic of the bonding apparatus of the invention, the apparatus also has a treatment chamber enclosing the substrate carrier device, the treatment chamber comprising temperature control means.

BRIEF DESCRIPTION OF THE DRAWINGS

Other characteristics and advantages of the invention become apparent from the following description of particular implementations of the invention given by way of non-limiting example and made with reference to the accompanying drawings, in which.

DETAILED DESCRIPTION OF THE INVENTION

The present invention is of general application to the production of composite structures comprising at least bonding, for example, by wafer bonding, a first substrate or wafer comprising components onto a second substrate or wafer.

As described above, after bonding, the geometry of the first substrate is different from that which it had when the components thereof were being formed. As a consequence, after bonding, offsets are created in the structures of the first substrate, which causes an overlay and a distortion between the originally formed components and those formed subsequently.

In order to minimize these phenomena and to allow the subsequent production of components in alignment with those formed on the first substrate before bonding, the present invention proposes holding, during bonding, one of the two substrates on a holding surface of a support that has a flatness similar to or less than that of the support used to hold the first substrate during formation of the components. The flatness of the holding surface of the support used during bonding is preferably less than that of the support used when the components are being formed.

The holding surface of the support corresponds to the surface with which the substrate is flush, i.e., the surface of the support in contact with the substrate. Depending on the type of support used, this holding surface may be a continuous or discontinuous surface. For example, when using a support with an electrostatic or capillary attraction system to hold the substrate, the support generally has a continuous holding surface that is entirely in contact with the substrate when the substrate is flush against the support. In contrast, with a support using suction forces to hold the substrate, for example, the support may have grooves or cavities on its surface that can hold the substrate by suction through them. Under such circumstances, the holding surface of the support corresponds to the surface of the support located around the grooves or cavities, i.e., the surface in contact with the substrate when it is held flush against the support.

In the present invention, the flatness corresponds to the value of the distance between the lowest point and the highest point of the holding surface of the support. As an example, a flatness of $x$ micrometers means that every point of the designated surface is located between two parallel planes spaced apart by $x$ μm.

A method of producing a three-dimensional structure by transfer of a layer of microcomponents formed on an initial substrate onto a final substrate in accordance with one implementation of the invention is described below with reference to FIGS. 2A to 2E and 3. The substrates are wafers that may have diameters of 150 mm, 200 mm or 300 mm.

Figure 1A:
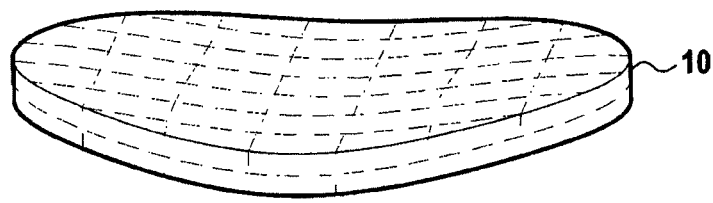
FIGS. 1A to 1F are diagrammatic views showing the prior art production of a three-dimensional structure.
Figure 1B:
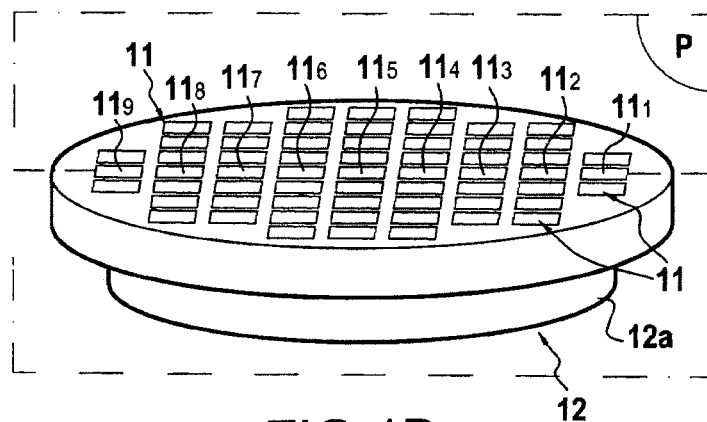
Figure 1C:
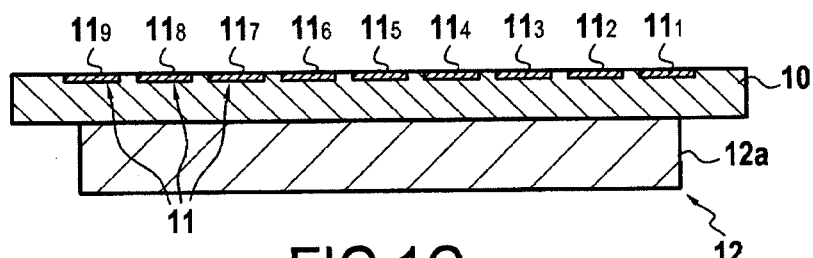
Figure 1D:
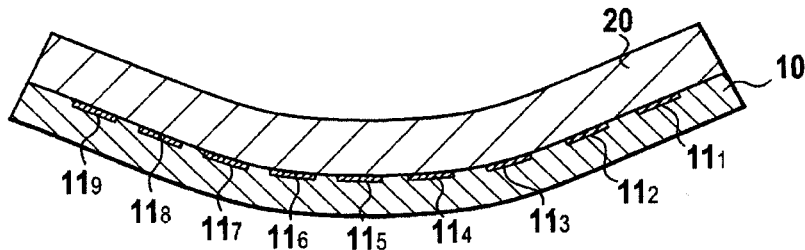
Figure 1E:
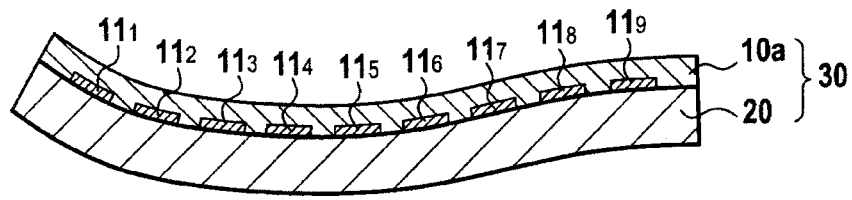
Figure 1F:
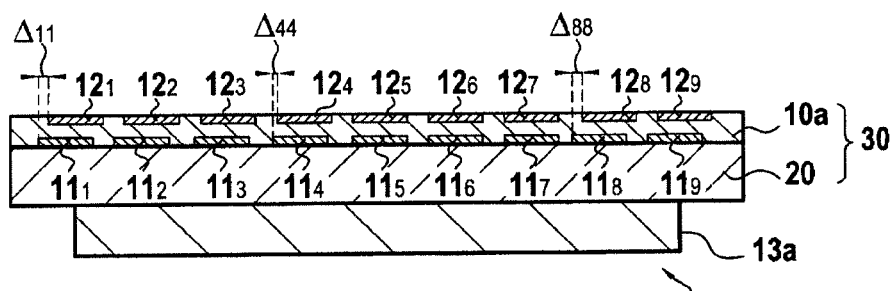
Figure 2A:
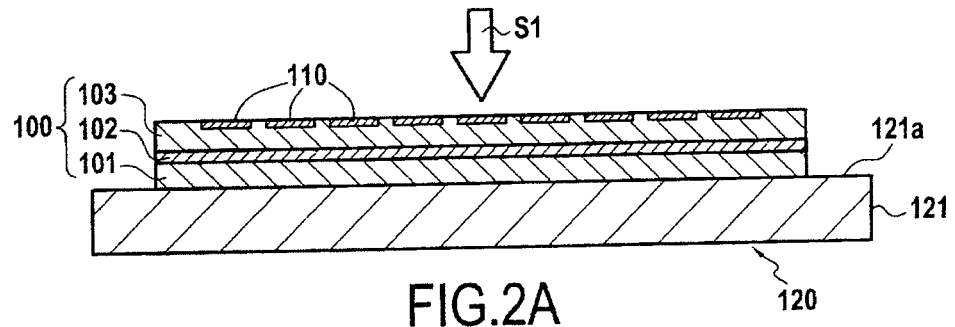
FIGS. 2A to 2E are diagrammatic views showing the production of a three-dimensional structure employing the assembly method of the present invention.

Production of the three-dimensional structure commences by forming a first series of microcomponents 110 on the substrate of a wafer or initial substrate 100 (FIG. 2A, step S1). The microcomponents 110 may be entire components and/or only portions thereof. In the example described herein, the initial substrate 100 is a 300 mm diameter SOI (silicon on insulator) type wafer comprising a layer of silicon 103 on a support 101, also of silicon, a buried oxide layer 102, for example, formed from $SiO_2$, being disposed between the layer and the silicon support.

The initial substrate 100 may also be constituted by a multilayer structure of another type or by a monolayer structure.

The microcomponents 110 are formed by photolithography using a mask that can define zones for forming patterns corresponding to the microcomponents 110 to be produced.

In accordance with the invention, when the microcomponents 110 are being formed by photolithography, the initial substrate 100 is held on a substrate carrier device 120. The substrate carrier device comprises a support platen 121 having a holding surface 121a with which the initial substrate 100 is held flush using an electrostatic system associated with the support platen 121. The flatness of the holding surface 121a of the support platen 121 is generally 2 micrometers (μm) or less.

Figure 2B:
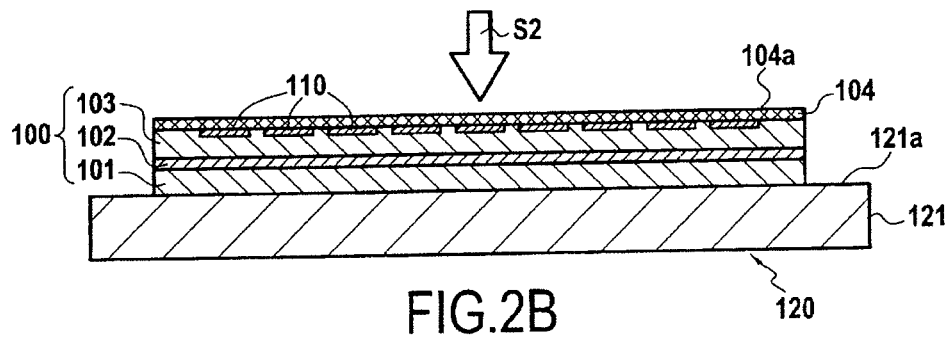

After forming the microcomponents, a layer of oxide 104, for example, of $SiO_2$, is deposited on the surface of the initial surface 100 comprising the microcomponents 110 with a view to preparing for bonding (step S2, FIG. 2B). Optionally, on the back face of the initial substrate (i.e., the face not comprising microcomponents 110), it is possible to form compensating layers in order to reduce the bow and/or warp that could have been created by formation of the components.

Next, a surface 104a of the oxide layer 104, as well as the surface 200a of a final substrate or wafer 200 formed from silicon, are prepared in order to bond them (step S3). Metal pins, for example, formed from copper, may be provided on the surface of the layer 104a and in contact with all or part of the microcomponents 110 in order to be able to bring the microcomponents 110 into contact with other microcomponents present in the final substrate. As with the initial substrate, the final substrate 200 may also comprise a layer of oxide and, optionally, metal pins on its bonding face. The treatments carried out in order to prepare the surface vary as a function of the bonding energy that is to be obtained. If a standard bonding energy is to be obtained, i.e., relatively weak bonding energy, the surface may be prepared by carrying out chemical-mechanical polishing followed by a clean. Alternatively, if a high bonding energy is to be obtained between the two substrates, preparation of the surface includes an RCA type clean (namely, a combination of SC1 treatment ($NH_4OH$, $H_2O_2$, $H_2O$) that is adapted to remove particles and hydrocarbons, and SC2 treatment (HCl, $H_2O_2$, $H_2O$) that is adapted to remove metallic contaminants), plasma surface activation, and an additional clean followed by scrubbing.

In a variation, the final substrate 200 may also comprise components that are either directly formed thereon or formed during a preceding transfer step.

Figure 2C:
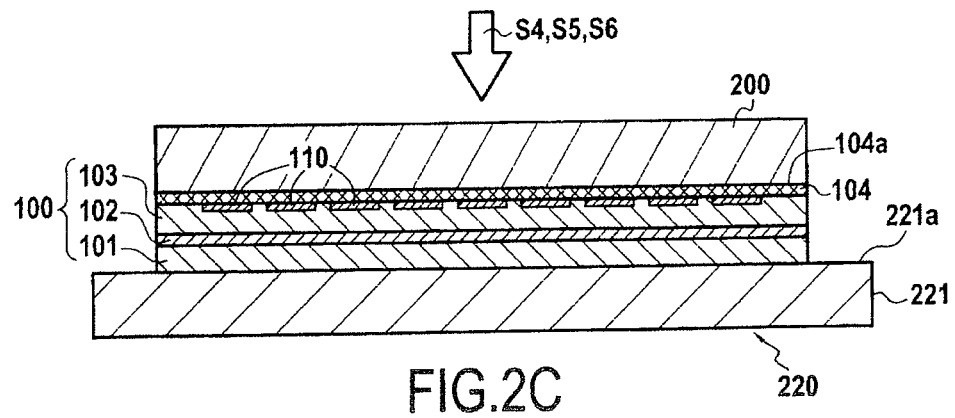

In accordance with the invention, during bonding, the back face of one of the two substrates is held on a holding surface of a support that has a flatness that is similar to or less than that of the support used during formation of the microcomponents, i.e., a flatness of 2 micrometers or less, preferably less than 2 micrometers. As can be seen in FIG. 2C, the back face of the initial substrate 100 is held on a substrate carrier device 220 belonging to a bonding apparatus (not shown in FIG. 2C). The substrate carrier device comprises a support platen 221 having a holding surface 221*a* with which the back face of the initial substrate 100 is held flush by means of an electrostatic system associated with the support platen 221. The flatness of the holding surface 221*a* of the support platen 221 is 2 μm or less, preferably less than 2 μm.

As can be seen in the example described herein, it is the initial substrate on which the components have been formed that is preferably placed and held flush against the support. Under such circumstances, holding the initial substrate on the support means that bow and/or warp of the substrate can be compensated for, in particular, if it does not include a compensating layer or if the surface preparation steps have resulted in the creation of such deformations. Further, bringing the back face of a substrate into contact with the support may result in the creation of defects (scratches, particulate contamination, etc.), and so it is preferable for the back face of the initial substrate to be in contact with the support, since this will subsequently be thinned.

Once the initial substrate has been placed on and held flush against the support platen 221 of the substrate carrier device 220, the final substrate 200 is placed on the initial substrate in order to bring the surface 104*a* of the initial substrate into intimate contact with the face of the final substrate 200 with a view to bonding by wafer bonding (step S4). Bonding by wafer bonding is a technique that is known *per se*. It should be recalled that the principle of bonding by wafer bonding is based on bringing two surfaces into direct contact, i.e., without using a specific material (adhesive, wax, solder, etc.). Such an operation requires that the surfaces for bonding are sufficiently smooth, free of particles or contamination, and are sufficiently close together to allow contact to be initiated, typically at a distance of a few nanometers or less. The attractive forces between the two surfaces are then high enough to cause molecular adhesion (bonding induced by the total of the attractive forces (Van der Waals forces) of electronic interaction between atoms and molecules of the two surfaces to be bonded).

Next, bonding by wafer bonding proper is carried out by delicately pressing using a tool, for example, a stylus, on the upper face of the final substrate 200, in order to initiate propagation of a bonding wave (step S5). The point at which the tool is applied may, for example, be located at the center or at the edge of the wafer. The mechanical pressure exerted by the tool may be in the range 1 MPa [megapascal] to 33.3 MPa and is applied to a bearing surface of 1 $mm^2$ [square millimeter] or less. The two substrates are then bonded together by wafer bonding over the whole of their surfaces in contact (bonding interface). This thereby produces a buried layer of microcomponents 110 at the bonding interface between the substrates 100 and 200.

During bonding, the temperature of the substrates is preferably controlled. To this end, the bonding apparatus may, for example, comprise a closed chamber enclosing the substrate carrier device. The temperature of the substrates may be adjusted by temperature control means belonging to the chamber (heating and/or cooling system for the atmosphere in the chamber) and/or belonging to the substrate carrier device (cooling fluid circulating in the support platen and/or heating means integrated into the support platen).

In accordance with a first aspect, the substrates 100 and 200 are maintained at a substantially similar temperature. The temperature difference between the two substrates is preferably ±0.5° C. or less.

The temperature of the substrates may be accurately controlled at a reference temperature by maintaining, in the closed chamber of the bonding apparatus, an atmosphere at a controlled temperature during the steps of preparing to bond the substrates (scrubbing, cleaning, bringing into contact, etc.) and the bonding steps. The temperature of the support platen on which bonding is carried out, as well as the fluids applied to the substrates (cleaning, scrubbing), is also controlled according to the reference temperature.

Preferably, it is also ensured that the temperature during bonding and, optionally, during the bonding preparation steps, is substantially similar (to ±0.5° C.) to the temperature at which the microcomponents 110 are formed on the initial substrate 100 held on the substrate carrier device 120 by photolithography. This prevents any effects of expansion and of generating an overlay between these various steps.

After bonding, the resulting structure undergoes a moderate heat treatment (below 500° C.) in order to increase the bonding energy between the two substrates and to allow one of them to be subsequently thinned.

Figure 2D:
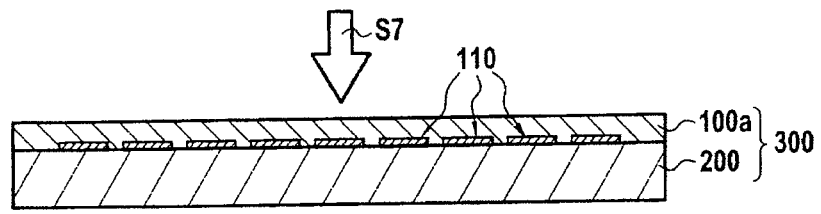

As can be seen in FIG. 2D, the initial substrate 100 is thinned in order to lift off a portion of the material present above the layer of microcomponents 110 (step S7). The initial substrate 100 may be thinned, especially by chemical-mechanical polishing (CMP), by chemical etching or by cleavage or fracture along a plane of weakness previously formed in the substrate by atomic implantation. When the initial substrate is a SOI type substrate as it is here, the buried insulating layer may advantageously be used as a stop layer for chemical etching to define the thickness of the remaining layer 100*a*. Alternatively, if the initial substrate is formed from bulk material, long pins, for example, pins formed from metal material regularly spaced on the surface of the substrate, may have been formed therein when the components are being formed in order to stop mechanical thinning (polishing).

Thus, a composite structure 300, formed by the final substrate 200 and a layer 100*a* corresponding to the remaining portion of the initial substrate 100, is formed.

Figure 2E:
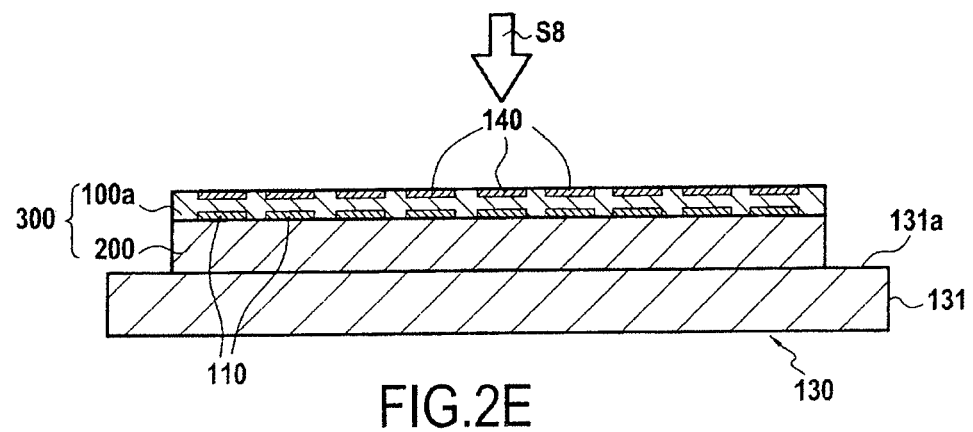
Figure 3:
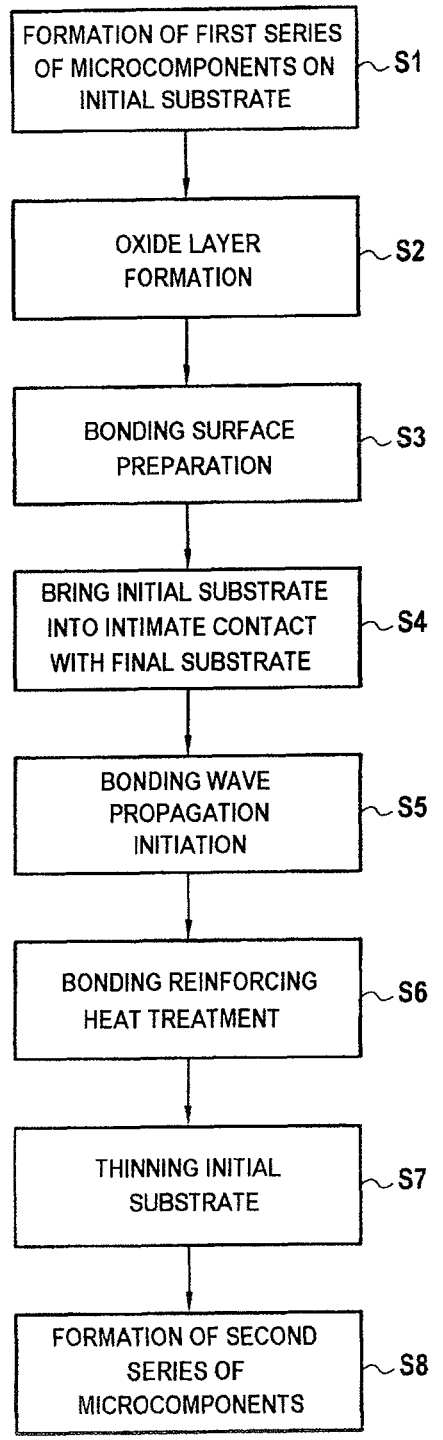
FIG. 3 is a flow chart of the steps employed during production of the three-dimensional structure illustrated in FIGS. 2A to 2E.

As can be seen in FIG. 2E, the next step in producing the three-dimensional structure consists of forming a second layer of microcomponents 140 in the exposed surface of the initial thinned substrate 100 (FIG. 2E, step S8). The microcomponents 140 may correspond to complementary portions of the microcomponents 110 in order to form a finished component and/or distinct components intended to function with the microcomponents 140. In order to form the microcomponents 140 in alignment with the buried microcomponents 110, a photolithography mask is used that is similar to that used to form the microcomponents 110.

Just as for the formation of the microcomponents 110, the composite structure 300 formed by the final substrate 200, and the layer 100a is held on a support platen 131 of a substrate carrier device 130 that is identical to the device 120, i.e., a platen having an electrostatic holding system, a holding surface 131a of which has a flatness of 2 micrometers or less. The photolithography mask is then applied to the free surface of the layer 100a.

In a variation, the three-dimensional structure is formed by a stack of layers, each layer having been transferred using the assembly method of the present invention (a first layer may already be present in the final substrate), and each layer being in alignment with the directly adjacent layers.

By means of the method of producing a composite structure of the invention, it is possible to bond the initial substrate 100 to the final substrate without deformation, or at least with a reduction in the deformations, in such a manner that significant offsets of the microcomponents 110 before and after transfer of the initial substrate 100 onto the final substrate 200 can no longer be observed. It is thus possible to limit these residual offsets to values of less than 200 nm, or even less than 100 nm, in a homogeneous manner over the entire surface of the wafer. The microcomponents 140, even of very small sizes (for example, <1 µm), can thus be formed easily in alignment with the microcomponents 110, even after transfer of the initial substrate. This means, for example, that the microcomponents present in the two layers or on two distinct faces of the same layer can be interconnected via metal connections, thereby minimizing the risks of poor interconnection.

As a consequence, the method of the present invention means that the phenomenon of overlay during transfer of a circuit layer onto another layer or onto a support substrate can be eliminated or at least reduced, and very high quality multilayer semiconductor wafers can be produced.

The invention claimed is:

1. A method of producing a composite structure, comprising:
   producing a first layer of microcomponents on one face of a first substrate, while holding the first substrate flush against a first holding surface of a first support platen of a substrate carrier device during production of the first layer of microcomponents; and
   wafer bonding, by molecular adhesion, the one face of the first substrate comprising the first layer of microcomponents onto a second substrate while holding the first or the second substrate flush against a second holding surface of a second support platen of a substrate carrier device, the second holding surface having a flatness that is less than that of the first holding surface of the first support platen.

2. The method of claim 1, further comprising selecting the flatness of the first holding surface of the first support platen to be 2 µm or less.

3. The method of claim 1, further comprising holding the first substrate flush against the second support platen while wafer bonding the one face of the first substrate onto the second substrate.

4. The method of claim 1, further comprising maintaining the first and second substrates at a substantially equivalent temperature while wafer bonding the one face of the first substrate onto the second substrate.

5. The method of claim 1, further comprising maintaining at least the first substrate at a temperature substantially equivalent to that of the first substrate during the production of the first layer of microcomponents on the face of the first substrate during wafer bonding of the one face of the first substrate onto the second substrate.

6. The method of claim 4, wherein maintaining the first and second substrates at a substantially equivalent temperature comprises maintaining the temperature difference between the first and the second substrates within ±0.5° C.

7. The method of claim 1, further comprising thinning the first substrate after wafer bonding the one face of the first substrate onto the second substrate.

8. The method of claim 1, further comprising producing microcomponents on the second substrate.

9. The method of claim 1, further comprising producing a second layer of microcomponents on another face of the first substrate opposite to the one face comprising the first layer of microcomponents.

10. The method of claim 1, further comprising forming a layer of oxide on the one face of the first substrate comprising the first layer of microcomponents before wafer bonding the one face of the first substrate onto the second substrate.

11. The method of claim 1, further comprising selecting the first substrate to comprise a SOI type structure.

12. The method of claim 1, wherein holding the first substrate flush against the holding surface of the first support platen comprises attracting, by capillary attraction or by an electrostatic force, the first substrate to the holding surface of the first support platen.

13. The method according to claim 1, further comprising cleaning the one face of the first substrate before wafer bonding the one face of the first substrate onto the second substrate.

14. The method according to claim 9, wherein producing the second layer of microcomponents on the another face of the first substrate comprises aligning at least one microcomponent of the second layer of microcomponents with at least another microcomponent of the first layer of microcomponents.

15. The method according to claim 14, wherein aligning the at least one microcomponent of the second layer of microcomponents with the at least another microcomponent of the first layer of microcomponents comprises limiting a residual offset between the at least one microcomponent and the at least another microcomponent to less than 200 nm.

16. The method according to claim 7, further comprising heat treating the first and second substrates after wafer bonding the one face of the first substrate onto the second substrate and before thinning the first substrate.

* * * * *

UNITED STATES PATENT AND TRADEMARK OFFICE
CERTIFICATE OF CORRECTION

PATENT NO. : 8,932,938 B2  
APPLICATION NO. : 13/255670  
DATED : January 13, 2015  
INVENTOR(S) : Arnaud Castex and Marcel Broekaart Page 1 of 1

It is certified that error appears in the above-identified patent and that said Letters Patent is hereby corrected as shown below:

In the specification:
COLUMN 4, LINE 28, change "example. due" to --example, due--

Signed and Sealed this  
Fifteenth Day of March, 2016

Michelle K. Lee  
*Director of the United States Patent and Trademark Office*